United States Patent
Chen (10) Patent No.: US 6,677,592 B2
(45) Date of Patent: *Jan. 13, 2004

(54) DEFLECTION LENS DEVICE FOR ELECTRON BEAM LITHOGRAPHY

(76) Inventor: Hsing-Yao Chen, 680 Bluff La., Barrington, IL (US) 60010

( * ) Notice: Subject to any disclaimer, the term of this patent is extended or adjusted under 35 U.S.C. 154(b) by 158 days.

This patent is subject to a terminal disclaimer.

(21) Appl. No.: 09/948,841

(22) Filed: Sep. 7, 2001

(65) Prior Publication Data

US 2002/0020823 A1 Feb. 21, 2002

Related U.S. Application Data

(63) Continuation-in-part of application No. 09/570,899, filed on May 15, 2000.

(51) Int. Cl.[7] .................................................. H01J 29/00
(52) U.S. Cl. ................................ 250/396 R; 250/492.2
(58) Field of Search ........................... 250/492.1, 492.2, 250/492.22, 492.23, 492.3; 315/409, 370

(56) References Cited

U.S. PATENT DOCUMENTS

| | | | |
|---|---|---|---|
| 3,900,760 A | 8/1975 | Glenn, Jr. et al. | 315/17 |
| 4,142,132 A | * 2/1979 | Harte | 315/370 |
| 4,272,204 A | 6/1981 | Quinn, Jr. et al. | 400/342 |
| 4,342,949 A | * 8/1982 | Harte et al. | 315/409 |
| 4,694,178 A | * 9/1987 | Harte | 250/396 R |
| 5,631,721 A | 5/1997 | Stanton et al. | 355/71 |
| 5,940,418 A | 8/1999 | Shields | 372/22 |
| 6,175,122 B1 | * 1/2001 | Groves et al. | 250/492.23 |

FOREIGN PATENT DOCUMENTS

| | | |
|---|---|---|
| EP | 0 848 540 | 6/1998 |
| EP | 0 992 347 | 4/2000 |
| EP | 1 024 010 | 8/2000 |
| GB | 2 362 608 | 11/2001 |
| JP | 8-336961 | 12/1996 |

OTHER PUBLICATIONS

Hsing–Yao Chen, William E. Glenn; IEEE Transactions on Electron Devices, vol. ED–23, No. 4, Apr. 1976; *The Principle and Test Results of a Large–Raster No–Mesh Return–Beam Electron–Camera Readout System*, Pp. 459–465.

* cited by examiner

*Primary Examiner*—John R. Lee
*Assistant Examiner*—Christopher M Kalivoda
(74) *Attorney, Agent, or Firm*—Emrich & Dithmar (57) ABSTRACT

An electron beam device includes an electron beam source, plural spaced plates having aligned apertures through which an electron beam is directed, an electrostatic focusing arrangement, and plural electrostatically charged deflection plates for deflecting the beam and displacing it over a target surface. The apertures in the spaced plates are of deceasing size in the direction of travel of the electron beam for intercepting the outer periphery of the beam and providing a beam of reduced cross section. The electron beam is simultaneously deflected by the deflection plates and focused by the electrostatic focusing arrangement. The electrostatic focusing arrangement includes first and second focusing elements through which the beam is directed which are disposed along the beamline and adjacent the upper and lower end portions, respectively, of the beam deflection plates. The electron beam device is of small size, permitting plural devices to be arranged in two- and three-dimensional compact matrix arrays for dense electron beam lithography arrangements such as for use in the simultaneous manufacture of large numbers of semiconductor devices to boost the throughput in integrated circuit manufacture inexpensively.

45 Claims, 6 Drawing Sheets

DEFLECTION LENS DEVICE FOR ELECTRON BEAM LITHOGRAPHY

RELATED APPLICATION

This application is a continuation-in-part of U.S. patent application Ser. No. 09/570,899, filed May 15, 2000.

FIELD OF THE INVENTION

This invention relates generally to the generation and use of high energy electron beams and is particularly directed to an electron device incorporating an electron beam deflection lens for use in electron beam lithography.

BACKGROUND OF THE INVENTION

In general, semiconductor devices are manufactured using photolithography techniques for reproducing the image of a reticle onto a photosensitive resist-covered semiconductor wafer. A light source in this photolithography approach typically directs ultraviolet (UV) light onto the photosensitive resist-covered semiconductor wafer. As the line width becomes more and more narrow such as in forming more compact electronic circuits, i.e., line widths of 0.35 μm and below, a UV light source of shorter wavelength is required. As the UV wavelength decreases, an optical glass lens becomes opaque to the UV light and a quartz optical lens is required. Even through quartz, transmission of UV light is limited resulting in corresponding limits on the intensity of the UV light directed onto the substrate. The use of quartz also increases the cost of this approach. In addition, with shorter wavelength UV light, the depth of focus also becomes proportionately more critical. Thus, the semiconductor wafer's surface flatness requirement becomes increasingly more difficult and costly to achieve.

Another approach has also been adopted in the fabrication of semiconductor devices. This latter approach employs an electron beam directed onto the semiconductor wafer for tracing out the desired integrated circuit pattern. This electron beam lithography approach also suffers from limitations which have restricted its adoption on a widespread basis in the fabrication of semiconductor devices. For example, the speed available in tracing the electron beam over the semiconductor wafer (substrate) is much slower than the speed achievable in a standard step-and-repeat optical device used in the above-described photolithography manufacturing approach. Also, current electron beam sources for use in semiconductor device lithography are too expensive and bulky to permit their adoption on a wide scale in the manufacture of semiconductor devices.

The present invention addresses the aforementioned limitations of the prior art by providing an electron beam device for use in electron beam lithography in the fabrication of semiconductor integrated circuits which does not require an expensive optical light source and lens mask combination, is capable of forming line widths of extremely small size on a semiconductor wafer, possesses a depth of focus at least ten times greater than that available in optical systems, employs a multi-stage digitized beam deflection system which provides precise control of electron beam position, and is compact in shape, small in size and of low cost.

OBJECTS AND SUMMARY OF THE INVENTION

Accordingly, it is an object of the present invention to provide apparatus for electron beam lithography such as used in the manufacture of semiconductor integrated circuit devices.

It is another object of the present invention to provide a small, compact electron beam device which can be used in two- and three-dimensional matrix arrays for producing dense circuit designs in simultaneously fabricating large numbers of semiconductor integrated circuit devices.

Yet another object of the present invention is to provide an electron beam device capable of directing an electron beam of very small cross section onto a substrate and precisely controlling the position of the beam on the substrate for fabricating a micro-miniature semiconductor integrated circuit device.

A further object of the present invention is to provide an electron beam source having a large depth of focus which is capable of accommodating substrates having reduced flatness characteristics in the manufacture of semiconductor integrated circuit devices by means of electron beam lithography.

A still further object of the present invention is to provide an electron beam device having a multi-stage beam deflection arrangement where each stage affords increasing beam deflection sensitivity for precisely controlling the position of one or more electron beams on a substrate for forming an integrated circuit thereon.

Another object of the present invention is to provide an electron beam device having multi-stage beam focusing and beam deflection arrangements which are substantially co-located and provide precise electron beam focusing and coarse, fine and intermediate electron beam deflection sensitivity for precise electron beam positioning on a substrate for the fabrication of integrated circuits and for relaxing some very restrictive mechanical tolerances in the device.

This invention contemplates an electron beam device incorporating a beam deflection lens for the simultaneous deflection and focusing of the electron beam, or beams, on a target surface such as a substrate used in the manufacture of semiconductor integrated circuit devices. The electron beam device further includes a beam source for directing an electron beam through plural aligned apertured plates arranged in a spaced manner along the direction of travel of the beam. Each of the plates includes a respective limiting aperture aligned along the beam axis, with the limiting apertures decreasing in diameter in proceeding along the direction of travel of beam. The apertured plates intercept peripheral portions of the electron beam in reducing beam cross section to provide a very narrow, precisely defined electron beam incident upon the substrate. Positioning electrodes may also be concentrically disposed about the beam axis and disposed between adjacent apertured plates for centering the beam. The beam limiting arrangement may also be in the form of a single apertured plate with a tapered aperture which is larger on the surface of the plate in facing relation to the source of energetic electrons. After transiting the beam limiting apertures in the aligned plates, the beam is then directed through a cylindrical shaped focusing electrode and then passes through plural electrostatic charged deflection plates disposed in a spaced manner about the electron beam. The position of incidence of the electron beam on the substrate is precisely controlled by the electrostatic charges applied to the deflection plates. In one embodiment, the deflection plates are angled away from the beam axis in proceeding along the direction of travel of the beam to provide precise, highly sensitive control of electron beam positioning. After transiting the deflection plate stage, the electron beam is further focused by means of a second electrostatic lens which also may be in the form of plural, flat, charged plates disposed in a spaced manner about the beam. Alternatively, the second electrostatic lens may also be a single member cylindrical in shape. The electron beam is simultaneously focused and deflected by means of the unique deflection lens arrangement of the inventive electron beam device for providing a small, compact device which can be arranged in two- and three-dimensional matrix arrays for simultaneously fabricating large numbers of dense electronic circuits in plural semiconductor integrated circuit devices. The electron beam is of a very small cross section and may be displaced, i.e., deflected over the substrate, for high speed, high density semiconductor integrated circuit device fabrication. Plural deflection stages are provided for coarse, fine and intermediate deflection sensitivity of the electron beam for precise positioning of the beam on the substrate. The beam deflection and focusing stages are substantially co-located along the electron beam axis.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENTS

Figure 1:
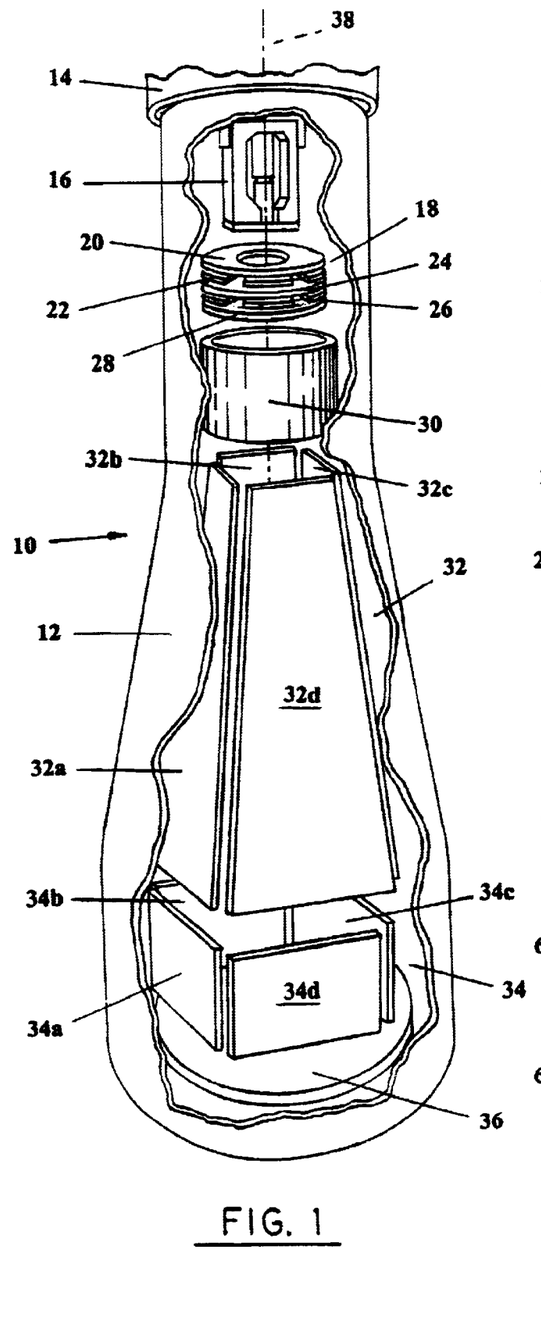
FIG. 1 is a partially cutaway perspective view of an electron beam device having a deflection lens in accordance with the present invention which is particularly adapted for use in electron beam lithography.

Referring to FIG. 1, there is shown a partially cutaway perspective view of an electron beam device 10 with a deflection lens for use in electron beam lithography in accordance with the principles of the present invention. The electron beam device 10 includes a tapered envelope 12 having a circular cross-section. Disposed on an end of the envelope 12 is a mounting socket 14 (partially shown in the figure) for electrically connecting the electron beam device 10 to a source of electrical power as well as to a source of control signals for operation of the electron beam device.

Figure 2:
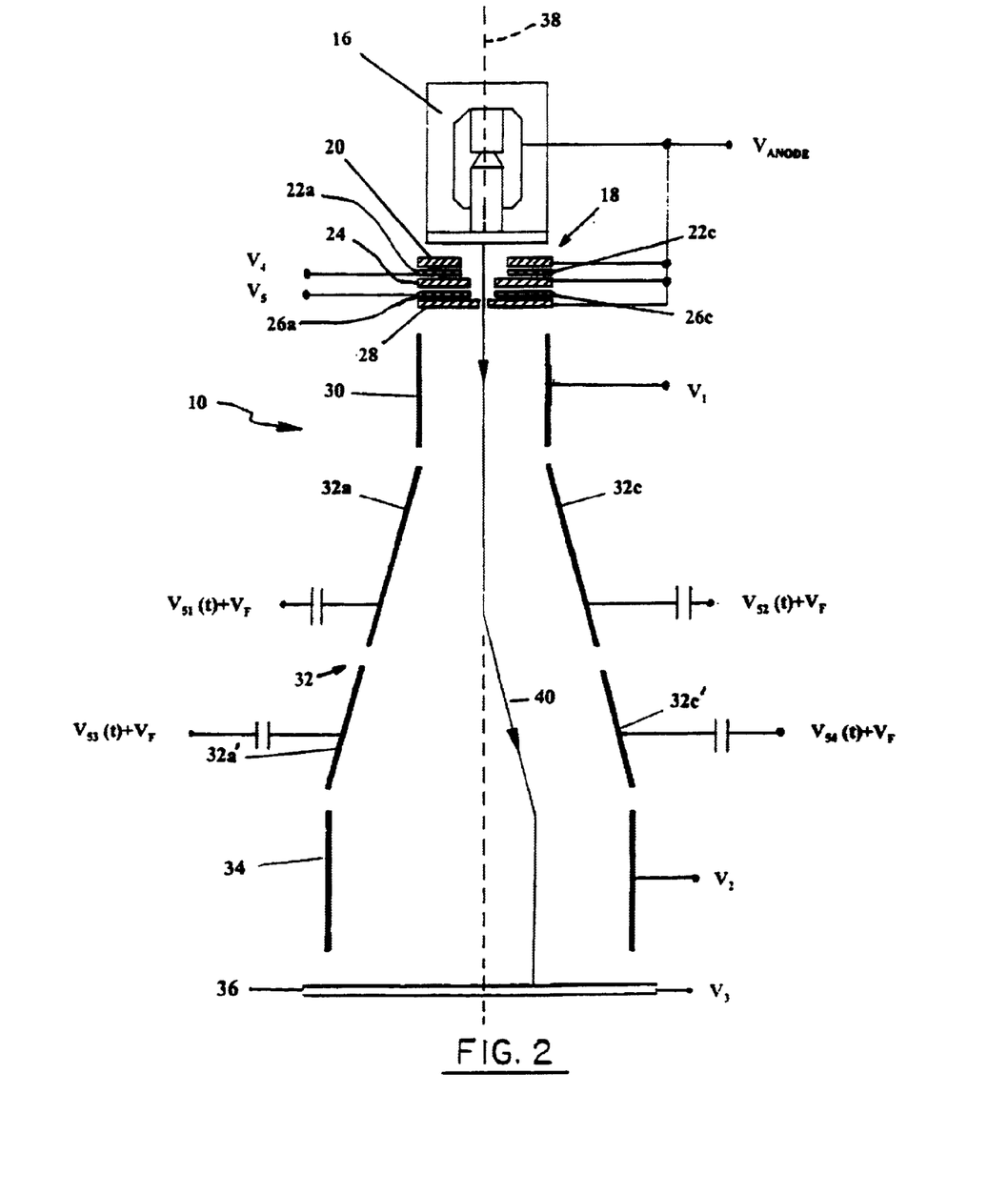
FIG. 2 is a longitudinal sectional view of the electron gun portion of the electron device shown in FIG. 1 further illustrating the electrical connections to the various components of the electron gun.

Electron beam device 10 includes an electron gun 16 which is attached to and electrically coupled to the mounting socket 14. Electron gun 16 generates energetic electrons and forms the electrons into a beam 40 as shown in the partial sectional view of the electron beam device of FIG. 2. For simplicity, the electron beam device's envelope has been omitted from the sectional view of FIG. 2. Energetic electrons in the electron beam 40 travel in the direction of the arrow heads superimposed on the electron beam as shown in FIG. 2.

Figure 1A:
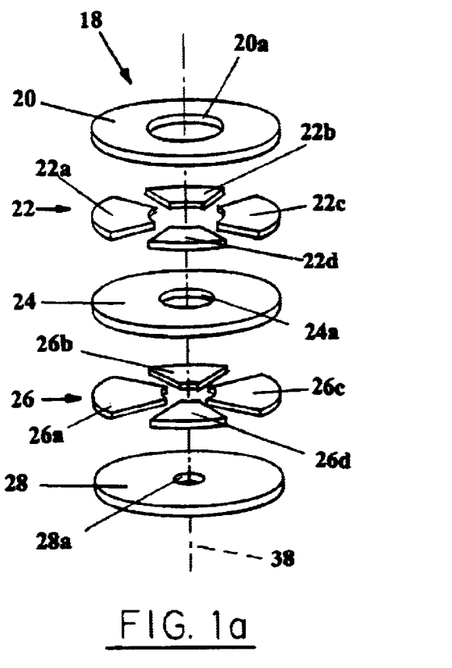
FIG. 1a is an exploded perspective view of an electron beam centering and cross section limiting aperture arrangement employed in the electron beam device of the present invention.

The energetic electrons in the electron beam 40 are directed by the electron gun 16 along a longitudinal axis 38 (shown in the figures in dotted line form) of the electron beam device 10. Electron beam 40 initially transits an electron beam limiter 18 comprised of first, second and third apertured plates 20, 24, and 28. An exploded perspective view of the electron beam limiter 18 is, shown in FIG. 1a. Each of the first, second and third plates 20, 24 and 28 is in the general form of a flat, round disk with each of the disks aligned along the axis 38 of the electron beam device 10. First plate 20 includes a center circular aperture 20a. Second plate 24 also includes a center circular aperture 24a. Finally, third plate 28 includes a center circular aperture 28a. The electron beam is directed through the three aligned apertures 20a, 24a and 28a in the first, second and third plates 20, 24 and 28. As shown in FIG. 1a, the three apertures 20a, 24a and 28a are of different sizes, with aperture 20a being the largest and aperture 28a being the smallest. Thus, the three beam passing apertures 20a, 20b and 20c are of decreasing size in proceeding in the direction of travel of the electron beam. Each of the three apertures 20a, 24a and 28a is sized so as to intercept a peripheral portion of the electron beam directed through the aligned apertures. Thus, aperture 20a intercepts a peripheral portion of the original electron beam, resulting in a reduction in the cross-section of the beam. Similarly, aperture 24a intercepts the peripheral portion of the reduced electron beam to further reduce the cross-section of the beam, with the beam then directed through aperture 28a in the third plate 28. Aperture 28a further reduces the cross-section of the beam to provide the beam with a very small cross-sectional area to produce a well defined electron beam spot size of very small dimensions on a target 36 which is aligned with the electron beam device 10 so as to intercept the electron beam. In the present example, target 36 is a substrate on which is formed an integrated circuit pattern by the electron beam 40 as it is displaced over the substrate in a manner described below.

Disposed between adjacent apertured plates and aligned along the electron beam device's longitudinal axis 38 are respective beam centering electrodes. Thus, a first beam centering electrode 28 is disposed intermediate the first and second apertured plates 20, 24. Similarly, a second beam electrode 26 is disposed intermediate the second and third apertured plates 24, 28. Each of the first and second beam positioning electrodes 22, 26 is coaxially disposed about the electron beam device's longitudinal axis 38 and is comprised of plural electrode elements disposed in a spaced manner about the axis. Thus, the first beam positioning electrode 22 includes first, second, third and fourth electrode elements 22a, 22b, 22c and 22d. The four electrode elements are symmetrically disposed about the electron beam device's longitudinal axis 38 in a spaced manner with the electron beam transiting the space between the four electrode elements. The second beam positioning electrode 26 similarly includes first, second, third and fourth electrode elements 26a, 26b, 26c and 26d which are symmetrical disposed about axis 38 in a spaced manner. Each of the electrode elements in each of the first and second beam positioning electrodes 22, 26 is connected to a set of voltage sources for electrostatically charging the electrode elements. This can be seen for the case of electrode elements 22a and 26a which are shown in FIG. 2 connected to voltage sources $V_4$ and $V_5$, respectively. The second and fourth electrode elements of each of the first and second beam centering electrodes 22 and 26 are similarly connected to respective voltage sources for electrostatically charging the electrode elements. Pairs of electrode elements in each of the first and second beam centering electrodes 22, 26 diametrically disposed on opposed sides of the axis 38 electrostatically center the electron beam 40 within the three aligned apertures 20a, 24a and 28a respectively in the first, second and third plates 20, 24 and 28. The relative polarity and voltage difference between diametrically opposed electrode elements is used to precisely position the electron beam. This ensures that the most intense, or densest, and the most paraxial (closest to the beam axis) portion of the electron beam 40 is used for forming the reduced cross-section electron beam incident on the target 36.

Figure 1B:
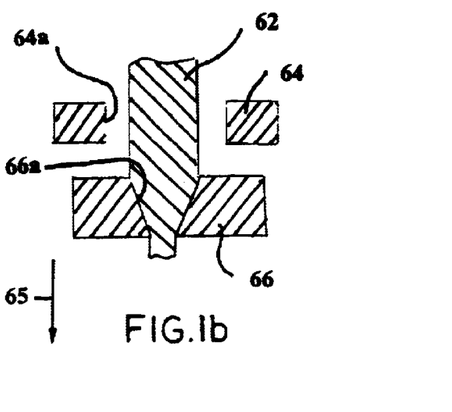
FIG. 1b is a sectional view of another arrangement for limiting the cross section of the electron beam in the electron beam device of the present invention.

Referring to FIG. 1b, there is shown another embodiment of an electronic beam limiting arrangement for use in the present invention. FIG. 1b is a sectional view, where even the electron beam 62 is shown in section. Electron beam 62 first transits a beam centering device 64 having an aperture 64a through which the beam is directed. Beam centering device 64 electrostatically centers the electron beam 62 as described above in terms of the previously described embodiment. After transiting the beam centering device 64, the electron beam 62 is then directed through a tapered aperture 66a in a beam limiting plate 66 as the beam travels in the direction of arrow 65. Tapered aperture 66a reduces the cross-section of the electron beam 62 as the beam transits the beam limiting plate 66 as shown in the figure. The beam limiting plate 66 is preferably comprised of a heat resistant metal such as platinum having a thickness sufficient to dissipate the heat generated by electron beam 62 incident upon the plate.

Electron beam 40 is focused on the target 36 by means of the combination of a first focusing electrode 30 and electrostatic electron lenses 32 and 34. As shown in the figures, the first focusing electrode 30 is preferably in the form of a hollow cylinder aligned along the electron beam device's longitudinal axis 38. Electrostatic electron lens 34 may also be in the form of a hollow cylinder aligned coaxially with the electron beam device's longitudinal axis 38 as shown in FIG. 2. Electrostatic electron lens 34 may also be in the form of first, second, third and fourth lens elements 34a, 34b, 34c and 34d as shown in FIG. 1. Each of the lens elements is in the form of a rectangular, flat plate, with the plates arranged concentrically about the electron beam device's longitudinal axis 38 in a spaced manner. The plane of each of the first, second, third and fourth flat lens elements 34a, 34b, 34c and 34d is aligned parallel with the electron beam device's longitudinal axis 38 or they may be tapered. A first focus voltage $V_1$, is provided to the first cylindrical focusing electrode 30, while a second focus voltage $V_2$ is provided to the electrostatic electron lens 34. Where the electrostatic electron lens 34 is comprised of the four lens elements 34a, 34b, 34c and 34d shown in FIG. 1, the second focus voltage $V_{F2}$ is provided to each of the four lens elements. First and second electrostatic lenses are formed between the first focusing electrode 30 and an electron beam deflector 32 and between the electron beam deflector 32 and the electrostatic electron lens 34. In combination, the first focusing lens formed by electrodes 30 and 32 and the second electrostatic electron lens formed by electrodes 32 and 34 focus the electron beam 40 to a small spot on target 36.

Disposed intermediate the first cylindrical focusing electrode 30 and the electrostatic electron lens 34 and also aligned along the electron beam device's longitudinal axis 38 is the aforementioned electron beam deflector 32. In the described embodiment, electron beam deflector 32 is comprised of first, second, third and fourth generally flat deflector plates 32a, 32b, 32c and 32d. By applying an appropriate polarity and dynamic voltage value to each of the four deflector plates, the electron beam 40 is displaced over the target 36 in tracing out an electronic integrated circuit pattern on the target. The first and third lens elements 32a, 32c displace the electron beam 40 in a first direction while the second and fourth lens elements 32b, 32d displace the electron beam in a second direction. The first and second directions are transverse to one another, allowing the electron beam 40 to trace out a two-dimensional raster figure representing an electronic integrated circuit pattern on the target 36. A first dynamic sweep voltage $V_{S1}(t)+V_F$ is applied to the first lens element 32a, while a second dynamic sweep voltage $V_{S2}(t)+V_F$ is applied to the third lens element 32c as shown in FIG. 2. This permits the first and second lens elements 32a, 32c to displace the electron beam 40 in a direction generally in the plane of the figure. A similar sweep voltage arrangement is applied to the second and fourth lens elements 32b, 32d to displace the electron beam 40 in a direction generally perpendicular to the plane of the figure. A combination of the four electrostatically charged deflector plates deflects the electron beam 40 in two dimensions as the beam traces an electronic circuit pattern on target 36.

Various voltages are provided to the components of the electron beam device 10 as shown in FIG. 2. Thus, $V_{anode}$ is an anode voltage provided to the device's electron gun 16 as well as to the first, second and third apertured plates 20, 24 and 28. Fixed focus voltages $V_1$ and $V_2$ are respectively provided to the first cylindrical focusing electrode 30 and the electrostatic electron lens 34. Time variable deflection voltages $V_{S1}(t)+V_F$ and $VS_{S2}(t)+V_F$ change with time and are respectively provided to the first and third deflector plates 32a and 32c. Similar variable voltages are provided to the second and fourth deflective plates 32b and 32d although this is not shown in the figures for simplicity. A focus $V_F$ is added to the aforementioned time variable deflection voltages to provide a composite voltage to each of the four deflector plates. The $V_3$ is provided to the target 36.

FIG. 2 also includes additional elements not shown in FIG. 1 which form another embodiment of the present invention. Shown in FIG. 2 are auxiliary deflector plates 32a' and 32c'. Another pair of opposed auxiliary deflector plates disposed adjacent to deflector plates 32a' and 32c' are included in this embodiment of the invention, but are not shown in the figure for simplicity. The second set of auxiliary deflector plates are disposed between the first set of primary deflector plates 32a–32d and the electrostatic electron lens 34. As shown in FIG. 2, the second set of auxiliary deflector plates are much shorter than the first set of primary deflector plates and thus provide a much shorter deflection region for electron beam 40. A voltage $V_{S3}(t)+V_F$ is provided to deflector plate 32a', while voltage $V_{S4}(t)+V_F$ is provided to deflector plate 32c'. Similar voltages are provided to the other two auxiliary deflector plates disposed adjacent deflector plates 32a'and 32c'. Thus, different deflection voltages are provided to the first primary and second auxiliary sets of deflector plates as shown in FIG. 2. The first primary set of deflector plates including deflector plates 32a–32d are used for deflecting the electron beam 40 over the entire raster area of coverage as defined by target 36. The second deflection region defined by the auxiliary deflector plates including plates 32a' and 32c' are used for more precise positioning of the electron beam 40 on target 36. Thus, the auxiliary deflector plates including plates 32a' and 32c' provide a region of reduced deflection sensitivity for more precise positioning of the electron beam 40 on target 36. In the preferred embodiment, the dynamic voltages provided to both the primary and auxiliary deflector plates are digitized voltage for more accurate positioning of the electron beam 40 on target 36.

Because the optic lens focusing arrangement disclosed herein is not circular with respect to the electron beams passing through this focusing arrangement, the focused electron beams suffer from astigmatism. In order to correct for this astigmatism a 4- or 8-pole magnetic stigmator is disposed about the device's glass envelope 12 in the general area adjacent to or between the electron beam limiter 18 and the first cylindrical focusing electrode 30. This magnetic stigmator is not shown in the figures because it does not form a part of the present invention and because such peripherals are well known in design, configuration and operation to those skilled in the relevant arts.

Figure 3:
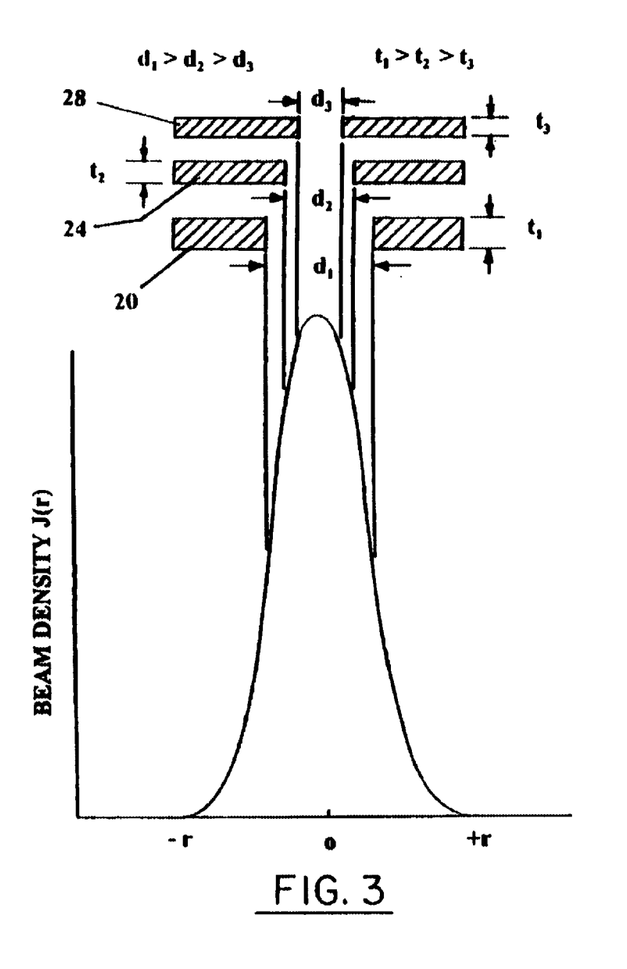
FIG. 3 is a graphic representation of the profile of a typical electron beam, with the effects of plural electron beam limiting apertures on the beam cross section also shown in the figure in accordance with one aspect of the present invention.

Referring to FIG. 3, there is shown a graphic representation of electron beam density distribution as a function of the size of a circular electron beam passing aperture for three different size apertures aligned along a common axis in accordance with one aspect of the present invention. As previously described, the first aperture plate 20 has a beam passing aperture of diameter $d_1$, while the second aperture plate 24 has a beam passing aperture of diameter $d_2$. The third aperture plate 28 has a beam passing aperture of diameter $d_3$, where $d_1>d_2>d_3$. As shown in FIG. 3, a cross-sectional diameter of the electron beam is reduced to the diameter $d_1$ of the aperture in the first plate 20 as the beam transits this plate. The cross-sectional diameter of the electron beam is further reduced to $d_2$ as the beam transits the second plate 24. The cross-sectional diameter of the beam is further reduced to $d_3$ when the electron beam transits the aperture in the third plate 28. It is in this manner that the cross-section of the beam is reduced to a small spot on the illuminated target 36 by using plural, spaced plates each having a smaller beam passing aperture. The cross-section of the electron beam may be reduced to a very small size without damaging the beam limiting plates such as by melting the portion of plate upon which the high energy electron beam is incident. The multi-stage beam intercepting arrangement of the present invention avoids damage by the high energy electron beam by isolating and dividing the high energy absorption among plural beam limiting plates. The tapered beam limiting aperture described above is made possible by use of the proper heat-resistant materials and by providing the beam limiting plate with sufficient thickness to be able to dissipate the absorbed energy in the form of heat.

Figure 4:
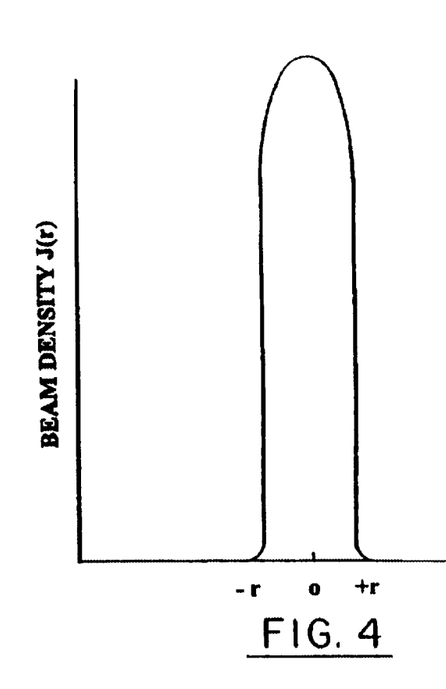
FIG. 4 is a graphic representation of the profile of an electron beam after transiting the first beam limiting aperture in the electron beam device of the present invention.

FIG. 4 is a graphic representation of electron beam density profile as a function of the size of the electron beam passing aperture for the case of the largest beam passing aperture in the first apertured plate 20. A comparison of FIGS. 3 and 4 shows that the second and third apertured plates 24, 28 further reduce the electron beam's profile, or cross-section, after the beam transits the aperture in the first plate 20.

Figure 5:
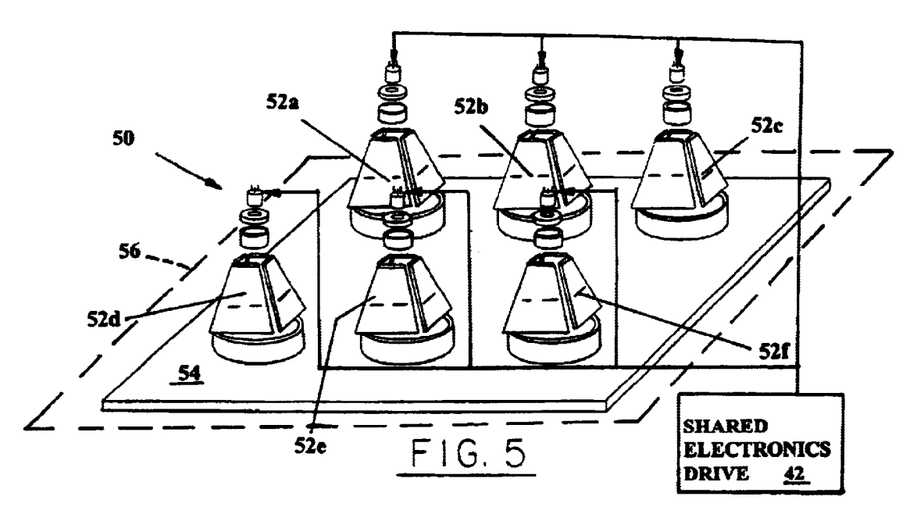
FIG. 5 is a simplified perspective view showing a two-dimensional matrix array of electron beam devices in accordance with another aspect of the present invention for simultaneously manufacturing plural semiconductor devices.

Referring to FIG. 5, there is shown a multiple electron beam device array 50 in accordance with another aspect of the present invention. As shown in the figure, plural electron beam devices 52a–52f are positioned above a substrate 54 and are arranged in an M×N matrix array for directing plural electron beams onto the substrate for simultaneously forming plural electronic circuit patterns on the substrate. In this manner, a large number of electronic circuit patterns may be simultaneously formed on the substrate 54 which may then be divided into smaller sections, each forming a separate individual semiconductor integrated circuit wafer. Alternatively, each electron beam may be incident on a separate semiconductor integrated circuit wafer for forming an integrated circuit pattern simultaneously on plural substrates. Also as shown in the figure in simplified schematic diagram form, each of the plural electron beam devices 52a–52f is attached to and supported by a support/displacement mechanism 56 (shown in the figure in dotted line form). The support/displacement mechanism 56 is connected to each of the electron beam devices 52a–52f for supporting and displacing the electron beam devices in simultaneously forming plural electronic circuit patterns on the substrate 54. The support/displacement mechanism 56 is shown simply as a planar element engaging and supporting each of the electron beam devices 52a–52f, but may take other forms such as separate mechanisms for supporting and displacing each of the electron beam devices. The support/displacement mechanism 56 may include convention displacement means as such as a stepping motor. In the alternative, each of the electron beam devices 52a–52f may be attached to a fixed support/displacement mechanism 56 and the substrate 54 may be displaced so that each of the respective electron beams trace out a separate electronic integrated circuit pattern on the substrate. Also as shown in the figure, each individual electron beam device may be connected to a common shared electronics drive circuit 42 which provides electric power and control inputs to each device. The shared electronic drive circuit 42 provides such inputs as high voltage, focus voltages, dynamic deflection voltages, video drive signals, etc., to reduce the cost of the matrix array of electron beam devices. In the alternative, the inputs from the shared electronic device circuit 42 provided to the various electron beam devices may include all of the aforementioned inputs except the video drive signals which may come from a different video drive signal source for each electron beam device. This latter embodiment would permit each electron beam device to simultaneously form a different circuit pattern on the substrate.

Figure 6:
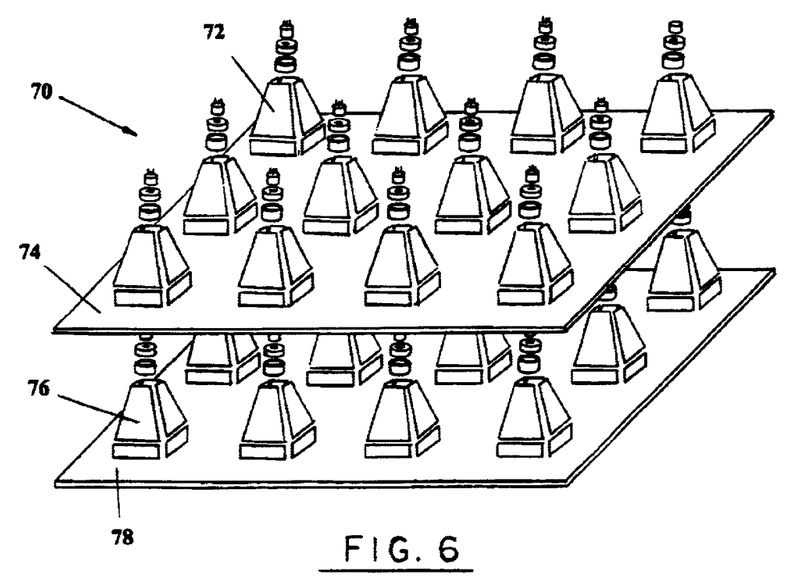
FIG. 6 is a simplified perspective view of a three-dimensional matrix array of electron beam devices in accordance with yet another aspect of the present invention for use in the simultaneous fabrication of plural semiconductor devices.

Referring to FIG. 6, there is shown another embodiment of a stacked electron beam device array 70 in accordance with another aspect of the present invention. In the stacked electron beam device array 70 of FIG. 6, an upper array of electron beam devices 72 (where only one of the electron beam devices is numbered for simplicity) is positioned above a first substrate 74 for directing plural electron beams onto the substrate for simultaneously forming plural electron beam circuit patterns on the substrate. Similarly, plural lower electron beam devices 76 direct electron beams onto a second lower substrate 78 for simultaneously forming plural electron circuit patterns on the substrate. The electron beam device matrix array of FIG. 5 and the stacked matrix array of electron beam devices of FIG. 6 allows for the simultaneous manufacture of large numbers of electronic integrated circuit patterns simultaneously to increase the throughput and reduce the cost of electronic circuit manufacture. These three dimensional matrix arrays also reduce the clean room space requirements for the integrated circuit pattern forming elements which also reduces manufacturing costs involved in building and maintaining an expensive "super clean room." The matrix array and stacked matrix array of multiple electron beam devices shown in FIGS. 5 and 6 is made possible by the small size of the electron beam device of the present invention which incorporates the inventive deflection lens arrangement.

Figure 7:
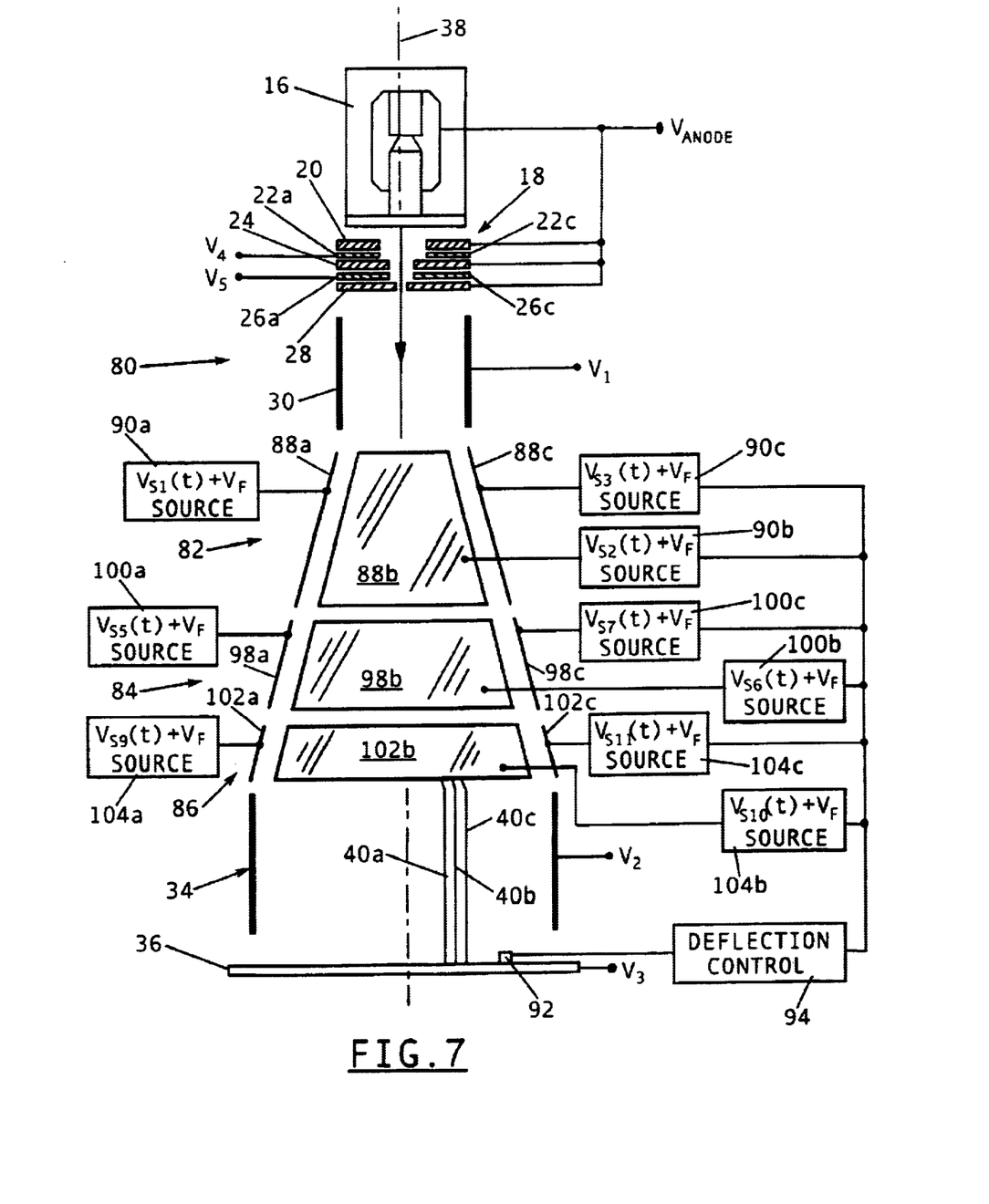
FIG. 7 is a simplified sectional and elevation view of an electron beam device having a deflection lens in accordance with another embodiment of the present invention which is also particularly adapted for use in electron beam lithography.

Referring to FIG. 7, there is shown a simplified sectional and elevation view of another embodiment of an electron beam device 80 with a deflection lens for use in electron beam lithography in accordance with the principles of the present invention. Elements in the electron beam device 80 of FIG. 7 corresponding to similar components shown in the electron beam device 10 of FIGS. 1 and 2 are identified by the same element number. Thus, for example, both embodiments of the electron beam device include the same electron gun 16, the same electron beam limiter 18, the same first cylindrical focusing electrode 30, and the same electron lens 34. Both devices also direct an electron beam on a substrate 36 for forming an integrated circuit thereon. In the case of the electron beam device 80 shown in FIG. 7, three electron beams 40a, 40b and 40c are simultaneously directed on the substrate 36 for forming an integrated circuit. Also as shown in FIG. 7, the three electron beams 40a, 40b and 40c are focused on the surface of the substrate target 36 to form multiple scan lines simultaneously to increase throughput as the beams are deflected. The electron beam device 10 of FIGS. 1 and 2 also contemplates use with plural electron beams as well as with a single electron beam as shown in the figures. The present invention, therefore, is not limited to directing a single electron beam on a substrate, but rather also contemplates simultaneously directing plural electron beams on the substrate for forming an integrated circuit. Such plural electron beam sources are conventional and well known to those skilled in the relevant arts. In additional, the integration of a plural electron beam source in the electron beam device of the present invention would not require undue experimentation or an extensive design effort, but could easily be performed by one skilled in the relevant arts.

Figure 8:
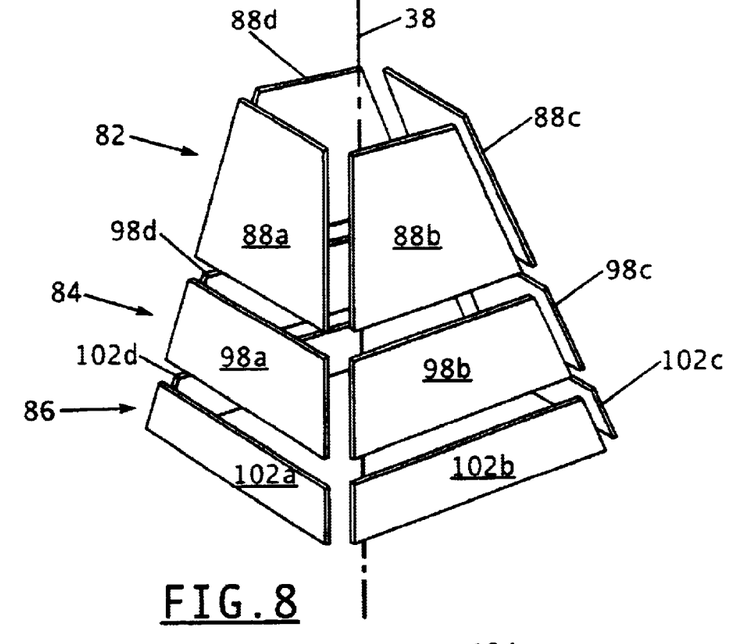
FIG. 8 is a perspective view of the electron beam deflection arrangement incorporated in the electron beam device of FIG. 7.

The difference in design and operation between the electron beam device 10 of FIGS. 1 and 2, and the electron beam device 80 of FIG. 7 is in the latter's use of a multi-stage electron beam deflection arrangement for providing increased beam deflection sensitivity for more precise positioning of the electron beam (or beams) incident on the surface of substrate 36. The electron beam deflection arrangement incorporated in electron beam device 80 includes first, second and third electron beam deflection stages 82, 84 and 86. A perspective view of this electron beam deflection arrangement is shown in FIG. 8. Each of the three deflection stages in the embodiment shown in FIGS. 7 and 8 is comprised of four deflection plates disposed symmetrically about the device's longitudinal axis 38 and connected to a respective deflection/focus voltage source. Each of the deflection plates in the embodiment shown in FIGS. 7 and 8 is in the form of a flat plate having a trapezoidal shape. The smaller edge of each of the deflection plates is in a facing relation to the device's first cylindrical focusing electrode 30, while the longer edge of each of the deflection plates is in facing relation to the device's electrostatic electron lens 34. In addition, the shorter edge of each of the deflection plates is in closer spaced relation to the device's longitudinal axis 38 than the deflector plate's longer edge.

The first deflection stage 82 thus includes first, second, third and fourth deflector plates 88a, 88b, 88c and 88d. The first deflector plate 88a is connected to a $V_{S1}(t)+V_F$ voltage source, while the second deflector plate 88b is connected to a $V_{S2}(t)+V_F$ voltage source 90b. The third deflector plate 88c is connected to a $V_{S3}(t)+V_F$ voltage source 90c. The fourth deflector plate 88d is similarly connected to a deflection/focus voltage source, although this is also not shown in the figures for simplicity.

The second deflection stage 84 includes fifth, sixth, seventh and eight deflector plates 98a, 98b, 98c and 98d. The fifth deflector plate 98a is connected to a $V_{S5}(t)+V_F$ voltage source, while the six deflector plate 98b is connected to a $V_{S6}(t)+V_F$ voltage source 100b. The seventh deflector plate within the second deflection stage 84 is connected to a $V_{S7}(t)+V_F$ voltage source 100c. The eighth deflector plate 98d in the second deflection stage 84 is similarly connected to a defection/focus voltage source, although this is also not shown in the figures for simplicity.

The third deflection stage 86 includes a ninth deflector plate 102a, a tenth deflector plate 102b, an eleventh deflector plate 102c, and a twelfth deflector plate 102d. The ninth deflector plate 102a is connected to a $V_{S9}(t)+V_F$ voltage source 104a, while the tenth deflector plate 102b is connected to $V_{S10}(t)+V_F$ voltage source 104b. The eleventh deflector plate 102c is connected to a $V_{S11}(t)+V_F$ voltage source 104c, while the twelfth deflector plate 102d is similarly connected to a deflector/focus voltage source, although this is also not shown in the figures for simplicity.

Electron beam deflection sensitivity of each of the deflection stages is determined by two factors. The first factor is the projected length of the deflector plates along the device's longitudinal axis 38. The longer the projected length of the deflector plate, the greater is the deflection sensitivity of the deflector plate. A deflector plate having a longer projected length along axis 38 will provide a greater deflection distance of the electron beam for a given deflection voltage applied to the plate. Thus, as shown in FIG. 7, the longer deflector plates in the first deflection stage 82 will have a greater deflection sensitivity than the shorter deflection plates of the second and third deflection stages 84 and 86. The second factor in determining electron beam deflection sensitivity is the average distance between the deflector plate and the longitudinal axis of the electron beam device 38. The shorter the average distance of the deflector plate from the axis 38, the greater the electron beam deflection sensitivity. Thus, all other parameters being equal, the closer a deflector plate is to axis 38, the greater will be the off-axis deflection of an electron beam.

As an example, the deflector plates of the first deflection stage 82 in the electron beam device 80 shown in FIG. 7 are disposed closer to and extend further along the length of the longitudinal axis 38 than the deflector plates in the second and third deflection stages 84, 86. For purposes of describing the operation of the present invention, the first deflection stage 82 is assigned an arbitrary deflection sensitivity of 1 Volt(V)/$10^{-5}$ meters (m). This means that with each volt of applied voltage in the form of a voltage difference between opposed deflector plates in the first deflection stage 82, an electron beam will be deflected $10^{-5}$ meters over the surface of the substrate target 36. The second deflection stage 84 for the case of a 1 volt differential between opposed deflector plates in this stage would provide a deflection of the electron beam less than that of the first deflection stage such as, for example, 1 V/$10^{-7}$ m. This means that a one volt differential between opposed deflector plates in the second deflection stage 82 would produce a $10^{-7}$ m deflection of an electron beam over the surface of the substrate target 36. Finally, because of the greater distances from and the shorter length along the longitudinal axis 38, the same voltage applied to the deflector plates of the third deflection stage 86 would result in less of a deflection of an electron beam across the substrate target 36 than for the case of the first and second deflection stages 82 and 84. As an example, a 1 volt differential between opposed deflector plates in the third deflection stage 86 would provide an electron beam deflection of $10^{-9}$ m over the surface of the substrate target 36. Thus, for a given voltage differential between opposed plates in a deflection stage, an electron beam is deflected a greater distance over the surface of the substrate target 36 by the first deflection stage 82 and is deflected a smaller distance by the third deflection stage 86. In this particular example, the first deflection stage 82 exhibits the greatest beam deflection sensitivity, while the third deflection stage 86 exhibits the smallest electron beam deflection sensitivity. The first deflection stage 82 having the greatest electron beam deflection sensitivity is used primarily for large displacement of the electron beam over the surface of the substrate target 36, while the third deflection stage 86 is used for smaller deflections of the electron beam across the surface of the substrate target. The second deflection stage 84 in this example exhibits an intermediate electron beam deflection sensitivity, producing beam deflection distances between that of the first and third deflection stages for the same deflection voltage.

Also shown in the electron beam device 80 is an electron beam sensor 92 disposed on the target 36. Electron beam sensor 92 is used to precisely locate the position of the electron beams on the target such as by periodically deflecting an electron beam(s) from its present position to electron beam sensor 92, determining the beam's location relative to the reference position of the sensor, and comparing the beam's actual position with its intended position on target 36. This position determination and comparison is made by a deflection control circuit 94 which is connected to the electron beam sensor 92. Deflection control circuit 94 is also connected to the various deflection voltage sources for providing an appropriate control signal for controlling the position of the electron beams on the target.

In order to enhance electron beam deflection sensitivity of the beam deflection arrangement shown in FIG. 7, each of the deflector plates in each of the deflection stages has provided with a digitized deflection voltage. This allows the electron beam device 80 shown in FIG. 7 to provide submicrometer beam landing location control. Where the deflection voltage power supply is capable of providing a digitized deflection voltage in the range of 1 V to 500V to the various deflection plates, the first, second and third deflection stages 82, 84 and 86 are capable of deflecting an electron beam in a step-wise manner as set forth in the following table:

TABLE I

| DEFLECTION STAGE | Deflection Sensitivity (Step-wise deflection) | Range of Deflection |
|---|---|---|
| First Deflection Section | 1V/$10^{-5}$m | $10^{-5}$ m to 5 × $10^{-3}$ m |
| Second Deflection Section | 1V/$10^{-7}$m | $10^{-7}$ m to 5 × $10^{-5}$ m |
| Third Deflection Section | 1V/$10^{-9}$m | $10^{-9}$ m to 5 × $10^{-7}$ m |

From Table 1, it can be seen that the first deflection section 82 is capable of deflecting an electron beam over a larger deflection range because of its greater deflection sensitivity, while the third deflection stage 86 deflects an electron beam over a reduced deflection range for the same deflection voltage because of its reduced deflection sensitivity. The first deflection stage 82 is thus particularly adapted for large deflection of an electron beam, while the third deflection stage 86 is particularly adapted for smaller deflections of an electron beam, such as in fine adjustment of electron beam position. The combined effects of the first, second and third deflection stages in deflecting an electron beam as shown in Table I is that the inventive beam deflection system can precisely move the beam over the surface of the substrate target along either x or y axes up to 5 mm off the axis in incremental steps of 0.001 microns for precise electron beam position control in an essentially continuous manner. An even smaller electron beam position control can be achieved by changing the deflection sensitivity of the system.

Figure 9:
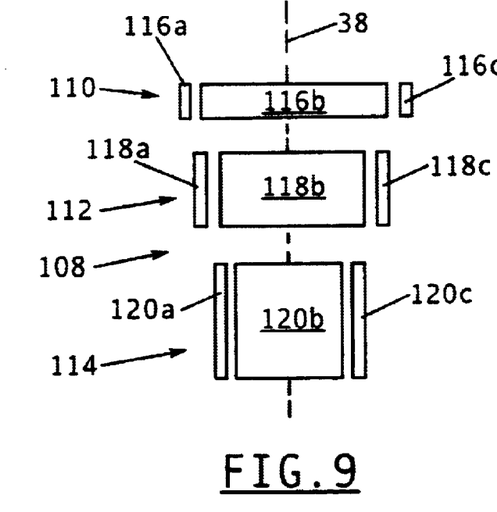
FIG. 9 is a side elevation view of another arrangement for deflecting an electron beam in accordance with the present invention.

Referring to FIG. 9, there is shown a side elevation view of an electron beam deflection arrangement 108 in accordance with another embodiment of the present invention. Beam deflection arrangement 108 includes first, second and third deflection stages 110, 112 and 114. The first deflection stage 110 includes four deflector plates, three of which are shown as elements 116a, 116b and 116c. Similarly, the second deflection stage 112 includes four deflector plates, three of which are shown as elements 118a, 118b and 118c. Finally, the third deflection stage 114 also includes four deflector plates, three of which are shown as elements 120a, 120b and 120c. As in the previously described embodiment, each of the deflector plates in the beam deflection arrangement 108 is generally planar in rectangular, or square, in shape. The difference between the embodiment shown in FIG. 9 and the previously described embodiment is that the plane of each of the deflector plates shown in the beam deflection arrangement 108 as aligned generally parallel to the longitudinal axis 38 of the electron beam device. In addition, in proceeding from the first deflection stage 110 to the third deflection stage 114, the projected length of the deflector plates along axis 38 increases and the spacing between the deflector plates and axis 38 decreases.

Thus, the first deflection stage 110 disposed in facing relation to the electron beam device's first cylindrical focusing electrode (not shown in FIG. 9 for simplicity) has the least electron beam deflection sensitivity, while the third deflection stage 114 has the greatest electron beam deflection sensitivity. This is the opposite order of electron beam deflection sensitivity in proceeding from the electron beam device's first cylindrical focusing electrode 30 to its electrostatic electron lens 34 to that for the embodiment shown in FIGS. 7 and 8. The present invention is thus independent of the order of electron beam deflection sensitivity of the various deflection stages in proceeding along axis 38 from the electron beam device's first cylindrical focusing electrode 30 to its electrostatic electron lens 34.

Figure 10:
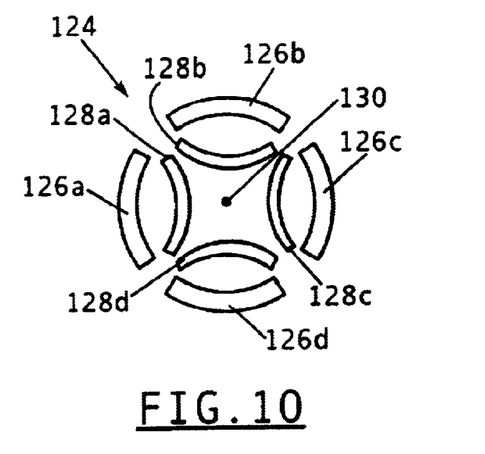
FIG. 10 is a simplified end-on view of another embodiment of a deflector plate arrangement for use in the present invention.

Referring to FIG. 10, there is shown a simplified end-on view of another embodiment of a deflection stage 124 for use in the present invention. Although only one deflection stage is shown in FIG. 10, plural such stages would be disposed in common alignment along the axis of the electron beam device as in the previously described embodiment. Deflection stage 124 includes a first set of deflector plates 126*a*–126*d*, as well as a second set of deflector plates 128*a*–128*d*. The first and second sets of deflector plates are systematically disposed about the electron beam axis 130. All of the deflector plates are curvilinear in shape and extend along the length of the electron beam axis 130. Each of the first set of deflector plates 126*a*–126*d* is concave in shape relative to the electron beam axis 130, while each of the second deflector plates 128*a*–128*d* is convex in shape relative to the electron beam axis. In combination, the first and second sets of deflector plates form a conjugate set system. Each set of deflector plates compensate for the other set of deflector plates in providing a given deflection sensitivity for the deflection stage. In the arrangement shown in FIG. 10, each of the deflector plates is provided with a deflection voltage of the same value in order to achieve this deflection sensitivity compensation effect.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. An electron beam device for directing at least one beam of energetic electrons onto a substrate for forming an integrated circuit pattern on the substrate, said electron beam device comprising:

a source of energetic electrons for directing at least one beam of electrons along an axis;

beam limiting means disposed along said axis adjacent said source of energetic electrons for intercepting a peripheral portion of said at least one electron beam and reducing the cross section of the electron beam;

focusing means disposed along said axis intermediate said beam limiting means and the substrate for forming a beam electrostatic focus region in the electron beam device for focusing said at least one electron beam to a spot on the substrate; and electrostatic deflection means disposed along said axis intermediate said beam limiting means and the substrate and generally co-located with said focusing means for forming a beam electrostatic deflection region for deflecting said at least one electron beam over the substrate in forming a circuit pattern on the substrate, wherein said beam electrostatic focus region and said beam electrostatic deflection region overlap and are coincident along said axis, and wherein said electrostatic deflection means comprises plural deflection stages each disposed in a spaced manner along said axis, wherein each of said deflection stages is spaced from said axis a first radial distance and extends along said axis a second axial distance, wherein the electron beam deflection sensitivity of each of said deflection stages increases as the first radial distance decreases and as the second axial distance increases.

2. The electron beam device of claim 1 wherein each of said deflection stages includes plural deflection plates disposed in a spaced manner about said axis.

3. The electron beam device of claim 2 wherein each of said deflection plates is generally flat and the deflection plates in a given deflection stage are spaced equidistant from said axis at a first radial distance.

4. The electron beam device of claim 2 wherein the second axial distances along said axis that the deflection plates in a given deflection stage extend are equal.

5. The electron beam device of claim 4 wherein each deflection plate has first and second opposed ends respectively disposed in facing relation to said beam limiting means and to said substrate, and wherein the first end of each of said plates is disposed closer to said axis than the second opposed end of the plate.

6. The electron beam device of claim 5 wherein each of said deflection plates is flat and generally trapezoidal in shape and said first end is parallel to and shorter than said second opposed end.

7. The electron beam device of claim 4 wherein each of said deflection stages includes four deflection plates, and wherein a first pair of deflection plates diametrically disposed with respect to said axis deflect the electron beam in a first direction and a second pair of deflection plates diametrically disposed with respect to said axis deflect the electron beam in a second direction, and wherein said first and second directions are transverse.

8. The electron beam device of claim 2 wherein each of said deflection plates is connected to a respective dynamic voltage source.

9. The electron beam device of claim 4 wherein in each of said deflection plates is flat and is aligned parallel to said axis.

10. The electron beam device of claim 9 wherein each of said deflection stages includes four deflection plates, and wherein a first pair of deflection plates diametrically disposed with respect to said axis deflect the electron a first direction and a second pair of charged deflection plates diametrically disposed with respect to said axis deflect the electron beams in a second direction, and wherein said first and second directions are transverse.

11. The electron beam device of claim 9 wherein each of said deflection plates is connected to a respective dynamic voltage source.

12. The electron beam device of claim 8 or claim 11 wherein in each dynamic voltage source provides a digital dynamic voltage to a deflection plate.

13. The electron beam device of claim 2 wherein a first deflection stage includes a first set of deflection plates for coarse deflection of the electron beam and a second deflection stage includes a second set of deflection plates for fine deflection of the electron beam.

14. The electron beam device of claim 13 further including a third deflection stage including a third set of deflection plates disposed intermediate said first and second deflection stages for intermediate deflection of the electron beam between the coarse and fine deflection of said first and second deflection stages.

15. The electron beam device of claim 1 wherein said source of energetic electrons comprises an electron gun.

16. The electron beam device of claim 14 wherein said beam limiting means includes plural, apertured plates disposed in a spaced manner along said axis, and wherein the apertures in said plates are aligned along said axis and said beam of electrons is directed through the aligned apertures.

17. The electron beam device of claim 16 wherein each of said apertures is circular and said apertures decrease in size in proceeding along said axis in the direction of travel of the beam.

18. The electron beam device of claim 17 wherein each of said plates has a respective thickness, with the thickness of said plates decreasing along said axis in the direction of travel of the beam.

19. The electron beam device of claim 18 wherein said beam limiting means comprises first, second and third generally flat apertured plates having thicknesses $t_1$, $t_2$, and $t_3$, respectively, and apertures having diameters $d_1$, $d_2$, and $d_3$, respectively, and wherein said first plate is in facing relation to said source of energetic electrons and said second plate is disposed intermediate said first and third plates, and wherein $t_1 > t_2 > t_3$ and $d_1 > d_2 > d_3$.

20. The electron beam device of claim 16 further comprising electrostatic beam positioning means disposed adjacent said plates for centering the electron beam in the apertures of said plates.

21. The electron beam device of claim 20 wherein said electrostatic beam positioning means includes plural electrostatically charged electrodes each aligned along said axis and disposed intermediate adjacent apertured plates.

22. The electron beam device of claim 21 wherein each of said electrostatically charged electrodes includes plural charged members disposed in a spaced manner concentrically about said axis, and wherein each of said charged members is equidistant from said axis.

23. The electron beam device of claim 22 wherein each of said plural members of an electrostatically charged electrode is connected to a respective voltage source.

24. The electron beam device of claim 23 wherein each voltage source is adjustable for providing selected voltages to the plural members of an electrostatically charged electrode.

25. The electron beam device of claim 22 wherein each electrode includes four members, and wherein a first pair of charged members diametrically disposed with respect to said axis center the electron beam in a first direction and a second pair of charged members diametrically disposed with respect to said axis center the electron beam in a second direction, and wherein said first and second directions are transverse.

26. The electron beam device of claim 1 wherein said beam limiting means includes an apertured plate disposed in a spaced manner along said axis, said plate including a tapered aperture through which said beam of electrons is directed, said tapered aperture defined by a larger opening on a first side of said plate in facing relation to said source of energetic electrons and a smaller opening on a second, opposed side of said plate in facing relation to said focusing means.

27. The electron beam device of claim 26 wherein said plate is comprised of a heat resistant metal such as platinum.

28. The electron beam device of claim 1 wherein said focusing means includes first and second focusing electrodes disposed along said axis on respective sides of said electrostatic deflection means, and wherein said first focusing electrode is in facing relation to said beam limiting means and said second focusing electrode is in facing relation to the substrate.

29. The electron beam device of claim 28 wherein said first and second focusing electrodes are generally cylindrical in shape and are concentrically disposed about said axis.

30. The electron beam device of claim 28 wherein said second focusing electrode includes plural charged lens elements disposed in a spaced manner about said axis.

31. The electron beam device of claim 30 wherein each of said lens elements is a generally flat plate connected to a respective voltage source, and wherein each of said flat plates is aligned generally parallel to said axis.

32. The electron beam device of claim 31 wherein said second focusing electrode includes four generally flat charged lens elements, and wherein a first pair of lens elements are diametrically disposed relative to one another with respect to said axis and a second pair of lens elements are diametrically disposed relative to one another with respect to said axis.

33. The electron beam device of claim 32 wherein said first focusing electrode is generally cylindrical in shape and is concentrically disposed about said axis.

34. The electron beam device of claim 1 further comprising an envelope substantially disposed about said source of energetic electrons, said beam limiting means, said focusing means, and said electrostatic deflection means.

35. The electron beam device of claim 34 wherein said envelope is comprised of glass.

36. The electron beam device of claim 33 wherein said envelope is conductive.

37. The electron beam device of claim 1 further comprising plural voltage sources each coupled to a respective deflection stage for providing a digital dynamic voltage having a beam focusing component and a beam deflection component to an associated deflection stage.

38. An electron beam device for directing at least one beam of energetic electrons onto a substrate for forming an integrated circuit pattern on the substrate, said electron beam device comprising;

a source of energetic electrons for directing at least one beam of electrons along an axis;

beam limiting means disposed along said axis adjacent said source of energetic electrons for intercepting a peripheral portion of said at least one electron beam and reducing the cross section of the electron beam;

first and second focusing means disposed in a spaced manner along said axis intermediate said beam limiting means and the substrate for forming a beam electrostatic focus region in the electron beam device for focusing said at least one electron beam to a spot on the substrate; and plural beam deflection stages disposed along said axis intermediate said beam limiting means and the substrate and generally co-located with said first and second focusing means and arranged in a spaced manner along said axis and including a first deflection stage for coarse deflection of said at least one electron beam on the substrate, a second deflection stage for intermediate deflection of said at least one election beam on the substrate, and a third deflection stage for fine deflection of said at least one electron beam on the substrate, wherein said second deflection stage is disposed intermediate said first and second deflection stages;

wherein each deflection stage includes plural charged plates disposed about said axis, with the plates in said first deflection stage extending a greater distance along and disposed in more closely spaced relation to said axis than the plates of said second deflection stage, and with the plates of said third deflection stage extending a shorter distance along and in greater spaced relation from said axis than the plates of said second deflection stage.

39. The electron beam device of claim 38, wherein each of said plates is coupled to and charged by a digital voltage source.

40. The electron beam device of claim 39, wherein the plates of each of said deflection stages are disposed symmetrically about said axis, with paired plates disposed on a opposed side of said axis.

41. The electron beam device of claim 40, wherein each digital voltage source provides a digital voltage having a focus component and a deflection component to an associated plate.

42. The electron beam device of claim 38, wherein each of said charged plates is generally flat and wherein the plates in each deflection stage are symmetrically disposed about and are aligned along said axis.

43. The electron beam device of claim 38, wherein each charged plate is aligned along said axis and is curvilinear in shape.

44. The electron beam device of claim 43, wherein said charged plates include first and second sets of plates having conjugate curvilinear shapes.

45. The electron beam device of claim 38, further comprising an electron beam deflection control coupled to said deflection stages and responsive to the position of the at least one electron beam on said substrate for providing a control signal to said deflection stages for controlling the position of the at least one electron beam on said substrate.

* * * * *

UNITED STATES PATENT AND TRADEMARK OFFICE
CERTIFICATE OF CORRECTION

PATENT NO. : 6,677,592 B2
DATED : January 13, 2004
INVENTOR(S) : Hsing-Yao Chen

It is certified that error appears in the above-identified patent and that said Letters Patent is hereby corrected as shown below:

Column 5,
Line 4, delete "centering electrode 28" and insert in its place, -- centering or positioning electrode 22 --
Line 5, after the word "beam" insert the word -- positioning --

Column 7,
Line 37, include a space after the word "or"

Column 14,
Lines 36 and 51, after the word "wherein" delete the word "in"
Line 42, after the word "electron" add the words -- beam in --
Line 43, delete the word "charged"

Column 16,
Line 58, delete "first and second" and insert in its place -- first and third --

Column 17,
Line 6, after the word "on" delete the word "a"
Line 7, delete the word "side" and insert "sides" in its place Signed and Sealed this Twentieth Day of April, 2004

JON W. DUDAS
*Acting Director of the United States Patent and Trademark Office*